(12) United States Patent
Bosboom et al.

(10) Patent No.: US 12,330,898 B2
(45) Date of Patent: Jun. 17, 2025

(54) APPARATUS, SYSTEM AND METHOD FOR CUTTING AND DELIVERING STAMPED CONTACTS

(71) Applicant: JABIL INC., St. Petersburg, FL (US)

(72) Inventors: Jeroen Bosboom, St. Petersburg, FL (US); Lucas Nielsen, St. Petersburg, FL (US); Ward Palmer, St. Petersburg, FL (US); Michael Patrick McKenney, St. Petersburg, FL (US); Babak Naderi, St. Petersburg, FL (US)

(73) Assignee: JABIL INC.

( * ) Notice: Subject to any disclaimer, the term of this patent is extended or adjusted under 35 U.S.C. 154(b) by 365 days.

(21) Appl. No.: 18/012,855

(22) PCT Filed: Jun. 25, 2021

(86) PCT No.: PCT/US2021/039120
§ 371 (c)(1),
(2) Date: Dec. 23, 2022

(87) PCT Pub. No.: WO2021/263121
PCT Pub. Date: Dec. 30, 2021

(65) Prior Publication Data
US 2023/0257227 A1   Aug. 17, 2023

Related U.S. Application Data

(60) Provisional application No. 63/043,817, filed on Jun. 25, 2020.

(51) Int. Cl.
*B65H 35/04*  (2006.01)
*B26D 7/18*  (2006.01)
(Continued)

(52) U.S. Cl.
CPC .............. *B65H 35/04* (2013.01); *B26D 7/18* (2013.01); *B65H 23/26* (2013.01); *B65H 41/00* (2013.01);
(Continued)

(58) Field of Classification Search
CPC ............. Y10T 83/2074; Y10T 83/2092; Y10T 83/222; Y10T 83/444; Y10T 83/4558;
(Continued)

(56) References Cited

U.S. PATENT DOCUMENTS 5,605,430 A * 2/1997 Legrady ............. H05K 13/0419
414/412
5,938,996 A   8/1999 Bianca et al.
(Continued)

FOREIGN PATENT DOCUMENTS

| EP | 0107737 A1 | 5/1984 |
| EP | 2793541 B1 | 12/2015 |
| KR | 1020130087717 A | 8/2013 |

OTHER PUBLICATIONS

International Search Report for PCT/US2021/039120, dated Oct. 22, 2021.
(Continued)

*Primary Examiner* — Phong H Nguyen
(74) *Attorney, Agent, or Firm* — Riverside Law LLP

(57) ABSTRACT

An apparatus, system and method for providing an automated contact cutter. The contact cutter includes a contact reel holder for holding therein a bandoleer comprising a plurality of stamped contacts; at least an inlet roller comprising an inlet pin, a turn roller, and a receiving roller mechanically connected by at least one motor drive belt to a drive motor, wherein the inlet roller is capable of receiving an end portion of the bandoleer onto the inlet pin for loading; a cutter between the turn roller and the receiving roller that (Continued)

is capable of cutting ones of the stamped contacts from the bandoleer for picking by a pick and place robot; and a comb capable of combing at least the bandoleer and cut and partially cut ones of the stamped contacts.

20 Claims, 9 Drawing Sheets

(51) Int. Cl.
  *B65H 23/26*   (2006.01)
  *B65H 41/00*   (2006.01)
(52) U.S. Cl.
  CPC .............. *B65H 2301/33222* (2013.01); *B65H 2403/20* (2013.01); *B65H 2403/80* (2013.01); *B65H 2511/515* (2013.01); *B65H 2553/412* (2013.01)
(58) Field of Classification Search
  CPC ............. Y10T 83/4455; Y10T 83/4463; Y10T 83/4637; Y10T 83/4653; Y10T 83/485; Y10T 83/8821; B26D 7/18; B65H 35/04; B65H 35/06; B65H 23/26; B65H 41/00; B65H 2553/412; B65H 2511/515; B65H 2403/20; B65H 2403/80; B65H 2301/33222; B65H 2301/4137; B65H 2404/143

See application file for complete search history.

(56) References Cited

U.S. PATENT DOCUMENTS

| | | | |
|---|---|---|---|
| 6,659,442 B1 * | 12/2003 | Steinborn | .............. B65H 39/16 83/167 |
| 2010/0022143 A1 | 1/2010 | Clark | |
| 2012/0255410 A1 | 10/2012 | Kido et al. | |
| 2022/0258373 A1 * | 8/2022 | Ueno | .................... B26F 1/0092 |

OTHER PUBLICATIONS

Written Opinion of the International Searching Authority for PCT/US2021/039120, dated Sep. 10, 2021.
International Preliminary Report on Patentability for PCT/US2021/039120, dated Dec. 13, 2022.
Extended European Search Report issued in App. No. EP21829568, dated Jul. 9, 2024, 5 pages.

\* cited by examiner

APPARATUS, SYSTEM AND METHOD FOR CUTTING AND DELIVERING STAMPED CONTACTS

CROSS-REFERENCE TO RELATED APPLICATIONS

The present application claims benefit of priority to International Application No. PCT/US2021/039120, filed Jul. 25, 2021, entitled: "Apparatus, System and Method for Cutting and Delivering Stamped Contacts, which claims priority to U.S. Provisional Application No. 62/043,817, filed Jun. 25, 2020, entitled: "Apparatus, System and Method for Cutting and Delivering Stamped Contacts," the entireties of which is incorporated herein by reference as if set forth in its entireties.

BACKGROUND

Field of the Disclosure

The disclosure is directed to process-line manufacturing, and, more particularly, to an apparatus, system and method for cutting and delivering stamped contacts in a manufacturing process.

Description of the Background

Conventional bandoleers are tape rolls that supply thereon component parts for manual, semi-automatic, or fully automatic manufacturing machines. For example, a bandoleer of electrical contacts may feed an automatic insertion machine for inserting electrical contacts into an electrical connection.

Bandoleers are typically provided from a respective feed reel, wherein the reel must be loaded manually and then advanced past a cutter to cut the contacts until the reel has run to its end. Known procedures thus require the laborious manual insertion of the end of the reel into a cutting system, followed by a constant manual advancing and/or monitoring of the cutting to avoid, for example, jamming, overstretching, breakage, miscuts, misalignments, and the like.

Conventional bandoleers are thus disadvantageous in that they cannot be sufficiently automated, are difficult to load, and are accordingly exposed to substantial miscutting and other similar critical process flaws. This can lead to wasted robotic run time, manufacturing line down-time, and significant material waste.

Therefore, the need exists for an improved apparatus, system and method for cutting and delivering stamped contacts.

SUMMARY

Certain embodiments are and include an apparatus, system and method for an automated contact cutter. The contact cutter includes a contact reel holder for holding therein a bandoleer comprising a plurality of stamped contacts integrated thereon; at least an inlet roller comprising an inlet pin, a turn roller, and a receiving roller mechanically connected by at least one common motor drive belt to a drive motor, wherein the inlet roller is proximate to and uphill from the contact reel holder and is capable of receiving an end portion of the bandoleer onto the inlet pin for loading of the bandoleer; a cutter between the turn roller and the receiving roller that is capable of cutting ones of the stamped contacts from the bandoleer, as portions of the bandoleer are advanced between the turn roller and the receiving roller, for picking by a pick and place robot; and a comb capable of combing at least the bandoleer and cut and partially cut ones of the stamped contacts towards the cutter.

Thus, the disclosure provides an apparatus, system and method for cutting and delivering stamped contacts.

BRIEF DESCRIPTION OF THE DRAWINGS

The exemplary compositions, systems, and methods shall be described hereinafter with reference to the attached drawings, which are given as non-limiting examples only, in which.

DETAILED DESCRIPTION

Figure 1A:
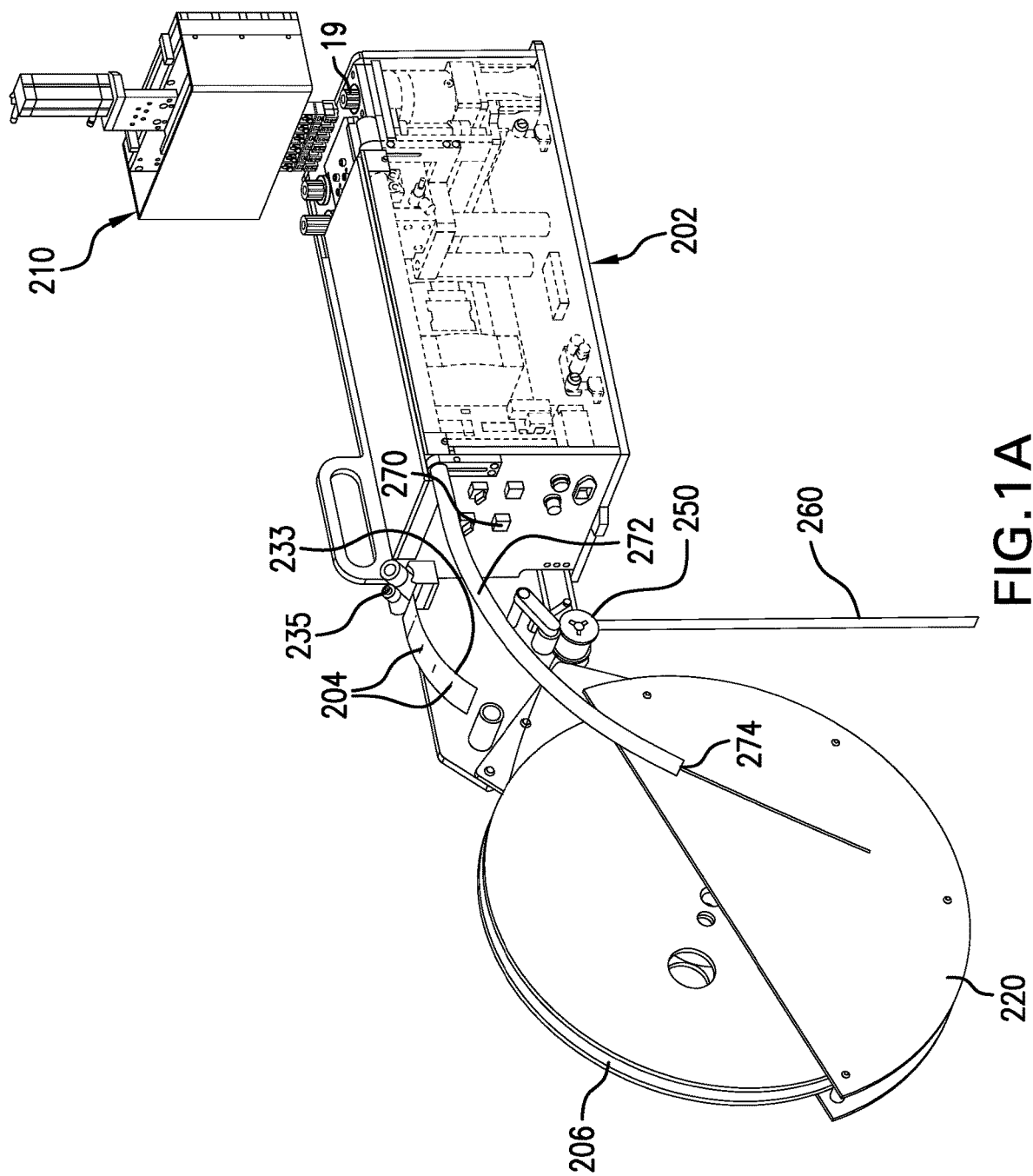
FIG. 1A is an illustration of a modular contact cutter.

The figures and descriptions provided herein may have been simplified to illustrate aspects that are relevant for a clear understanding of the herein described apparatuses, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, for the sake of brevity a discussion of such elements and operations may not be provided herein. However, the present disclosure is deemed to nevertheless include all such elements, variations, and modifications to the described aspects that would be known to those of ordinary skill in the art.

Embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that certain specific disclosed details need not be employed, and that embodiments may be embodied in different forms. As such, the disclosed embodiments should not be construed to limit the scope of the disclosure. As referenced above, in some embodiments, well-known processes, well-known device structures, and well-known technologies may not be described in detail.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

When an element or layer is referred to as being "on", "upon", "connected to" or "coupled to" another element or layer, it may be directly on, upon, connected or coupled to the other element or layer, or intervening elements or layers may be present, unless clearly indicated otherwise. In contrast, when an element or layer is referred to as being "directly on," "directly upon", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). Further, as used herein the term "and/or" includes any and all combinations of one or more of the associated listed items.

Yet further, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Thus, terms such as "first," "second," and other numerical terms when used herein do not imply a sequence or order unless clearly indicated by the context. Thus, a first element, component, region, layer or section discussed below could be termed a second element, component, region, layer or section without departing from the teachings of the embodiments.

The embodiments may provide an apparatus, system and method of providing a contact cutter for feeding and cutting of progressively stamped contacts. The contact cutter dispenses progressively stamped contacts from a reel, also referred to as a bandoleer. More particularly, the contact cutter feeds, cuts and presents these contacts for robotic pick and insertion.

The contact cutter may thus fit inside a robotic work cell that services a high speed assembly line, such as to provide just-in-time contact feeding. The disclosed cutter is compact and readily serviceable. The cutter may be manually operated or fully automated.

The cutter may typically advance contacts for cutting by advancing the bandoleer in small increments. After cutting, a new length is advanced for additional sequenced or simultaneous cutting of that new length, and so on. This progressive cutting uses a minimum of material, thereby reducing costs.

Each contact may be strain-relieved and combed at the cutter, as discussed throughout. The strain relief feature means that the contact need not be held while it is cut, thus reducing robot wait time. The combing may re-position any skewed contacts to the proper pitch.

The drive unit thus loads, indexes, cuts and clamps the contacts. The multiple rollers may equalize the load on the bandoleer, and thus minimize the risk of breakage or overstretch. Moreover, by using a roller at the load point, exit point, and at each turn along the bandoleer guide, the probability of back pressure or jamming are also reduced. Further, since the rollers stretch the bandoleer together and substantially equally, the stability of the bandoleer is maintained, and the bandoleer cannot buckle or mis-feed.

Further, although the disclosed examples typically present 6 (six) contacts for cutting at a time, the skilled artisan will appreciate, in light of the instant disclosure, that the embodiments may also dispense a single contact, or fewer or more than 6 contacts, at a time. This dispensing of contacts is ultimately for robotic pick and insertion, and may support simultaneous or sequential multiple insertions of cut contacts by the robotics.

FIG. 1A illustrates a contact cutter 100 according to embodiments. Although the contact cutter illustrated is a deck mounted 202 apparatus, the skilled artisan will appreciate that other mounting versions of the contact cutter 100 may be similarly employed.

The contact cutter 100 may feed, for cutting, progressive stamped contacts 204 from a contact reel 206 (a "bandoleer") for presentation to a pick and place robot 210. The bandoleer 206 may be held in a contact reel holder 220 at the "back" portion of the cutter 100, i.e., the curved reel holder 220 may be located on the contact cutter 100 opposite the cutting mechanism 19.

The bandoleer 206 may be drawn, along with the contacts 204 associated therewith, upwards, or "uphill" 233, via an inlet guide roller(s) 235. The inlet guide roller(s) 235 may, or may partially, rotate the bandoleer 206 as needed for the remainder of the process, and as such may constitute one or a series of guide rollers 235. For example, the inlet aspects may modify the orientation of the bandoleer 206 from a horizontal orientation as presented by the roll in the reel holder, to a 45 degree orientation, to an eventual vertical orientation for operations performed below on the bandoleer 206.

Figure 1B:
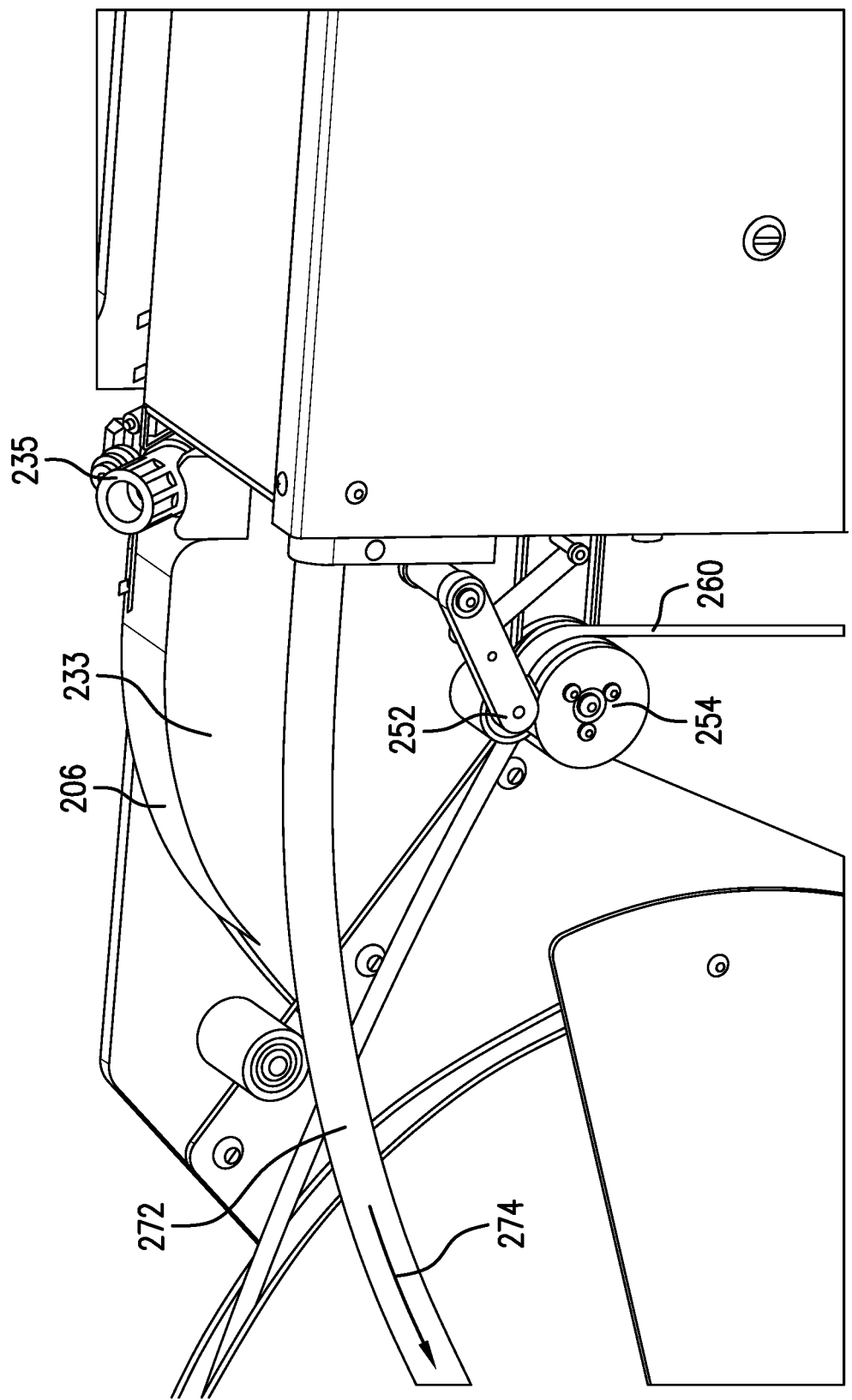
FIG. 1B is an illustration of a modular contact cutter.

The inlet aspects may also include a paper separator 250 along the upward feed ramp 233 before the inlet roller 120a discussed below. The paper separator 250 may comprise a pinch roller 252 and a dedicated stepper motor 254, as shown in FIG. 1B. The paper separator 250 removes the paper guard backing 260 from the bandoleer 206, and thus keeps the separated paper 260 bonded to the bandoleer 206 and the contacts 204 from being drawn into the cutter 19.

Also included may be integrated manual adjustments and/or controls 270. Embodiments may also have a path 272, such as a tube, for post-processed bandoleer scrap 274. As referenced, embodiments may expose the scrap-free cut contacts 204 to an end effector 210, such as a 6 grip pick and place end effector, for picking of the contacts.

Figure 2:
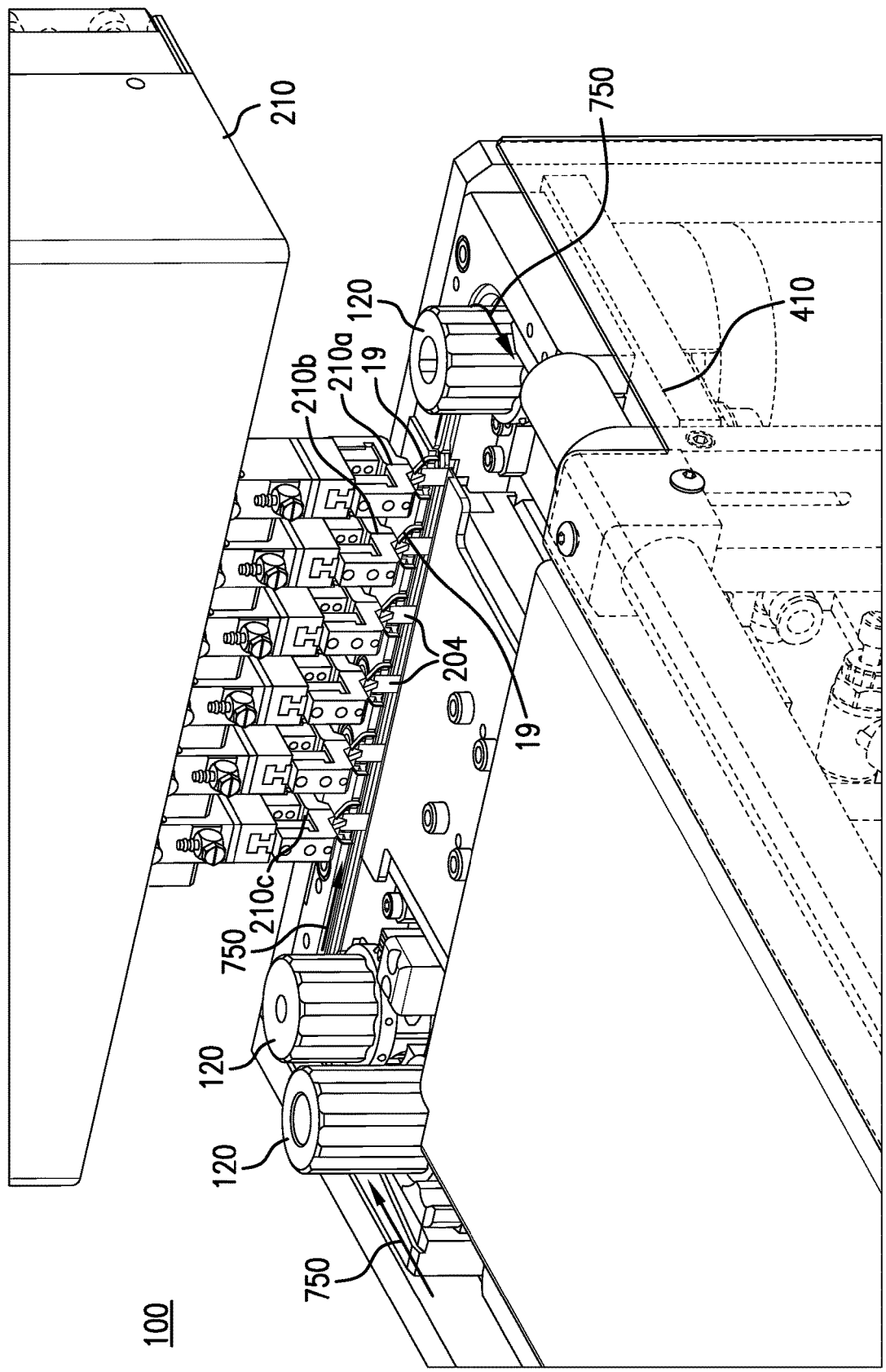
FIG. 2 is an illustration of aspects of a modular contact cutter.

FIG. 2 illustrates an additional view of the contact cutter 100. Evident in FIG. 2 are the multiple contact pick points 210a, b, c . . . by the multi-grip end effector 210, which picks the contacts 204, once cut from the bandoleer 206, along the bandoleer drive flow path. The drive flow path 750 is driven by a single motor 410, and may include one or more rollers 120 which may be passive, which may be driven by a series of dedicated motors, or which may be rotated by a common motor drive belt 420 associated with the single drive motor 410. Also illustrated in FIG. 2 is the spent bandoleer exit path 272.

Figure 3:
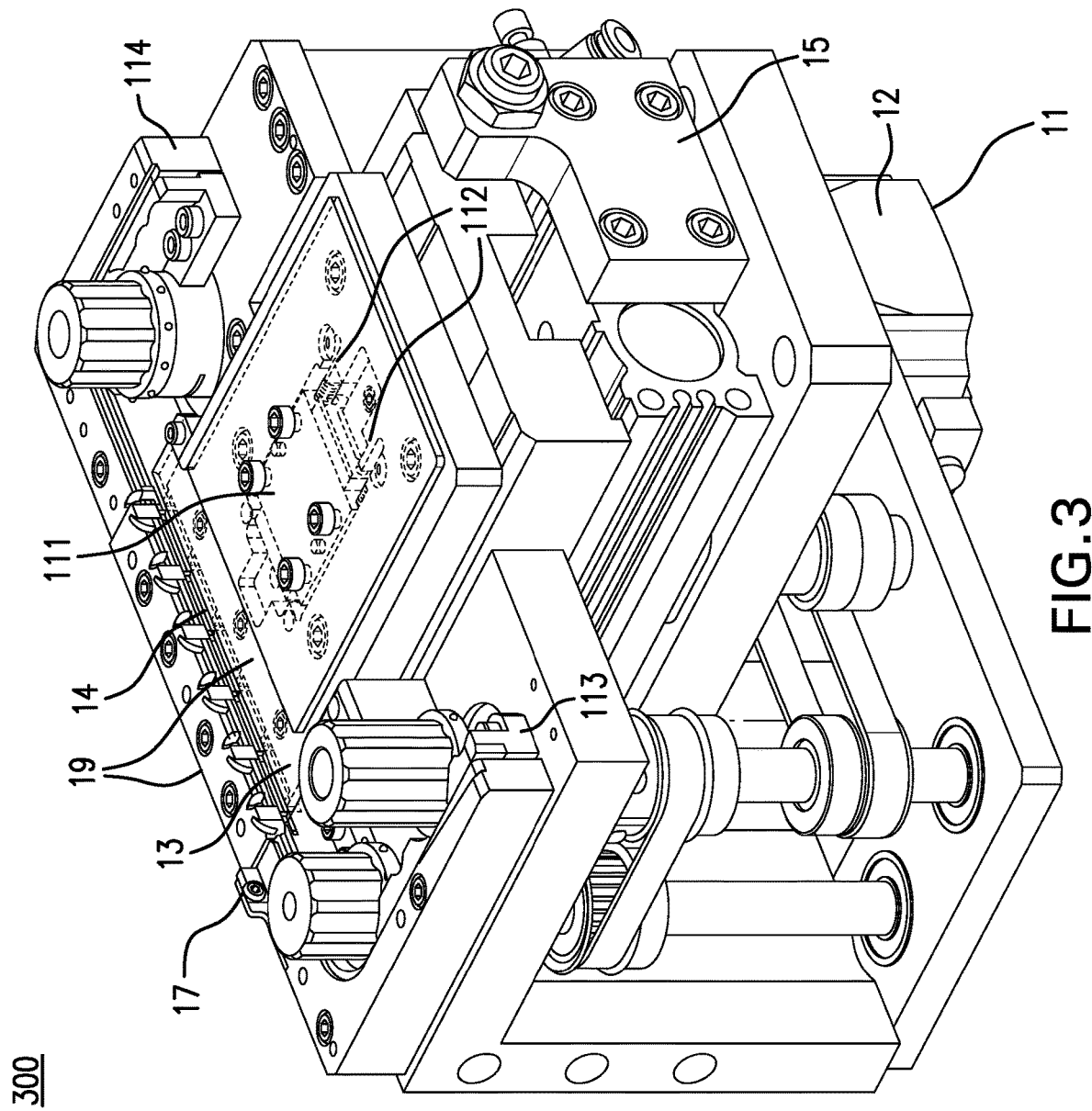
FIG. 3 is an illustration of aspects of a modular contact cutter.

FIG. 3 illustrates a contact feed drive and cut unit 300 for association with the disclosed contact cutter 100. The drive unit 300 may include a motor encoder 11 for the drive flow path driver motor 410, as well as a gear/gear reduction system 12, such as a planetary gear reduction, to drive the rollers of the drive flow path. By way of example, the motor 410 (not shown in FIG. 3) may be a stepper motor with an absolute encoder 11 and planetary gear reduction 12.

The inlet roller 13 may be as referenced above in FIG. 1, and may or may not be associated with reorientation aspects to act as an inlet guide roller 235 for the input bandoleer 206. Further, the bandoleer 206 may be received by the inlet roller along a bandoleer entry guide 113, such as may maintain the orientation of the bandoleer upon input. Various sensors 17, such as a missing part and/or location sensor for the bandoleer feed and/or the contacts, may be included in the embodiments. Such a sensor 17 or sensors may be or include, for example, optical through-beam sensors.

As is also shown, the cutters 19 may be readily interchangeable, such modularly and thus without disassembly of the drive and cut unit 300. A contact clamp aspect 14 of cutter 19 may, for example, correct the pitch of the bandoleer (or other parts) that are off-orientation for cutter actuation. Yet further, the cut sequence may be configurable, such as to sequentially cut densely pitched parts, or to simultaneously cut all cut-parts.

After cutting, the spent bandoleer may be fed through the exit path guide 114 to the bandoleer exit discussed above. The cutting comb associated with the cutters 19 may include any necessary bearings 111 and springs 112 required for cutting actuation. Also illustrated is a cut slide 15, which may be, for example, a cut slide 15 employing a cross roller without a lash bearing.

As such, the bandoleer may enter the inlet 13 via the guide 113. The sensor(s) 17 may monitor the bandoleer as it follows the drive flow path 310 as dictated by rollers 120 to the cutter 19. The cutter may then cut, for example, the contacts, which are picked by the end effector of FIG. 1, and the spent bandoleer may exit via guide 114, such as to the bandoleer exit chute of FIG. 1.

Thereby, the embodiments may provide a cutter 100 having a modular drive and cut unit 300. Moreover, the drive and cut unit 300 may be configurable, at least as to product pitch density, bandoleer presentation orientation, and bandoleer presentation band length, by way of non-limiting example.

Figure 4A:
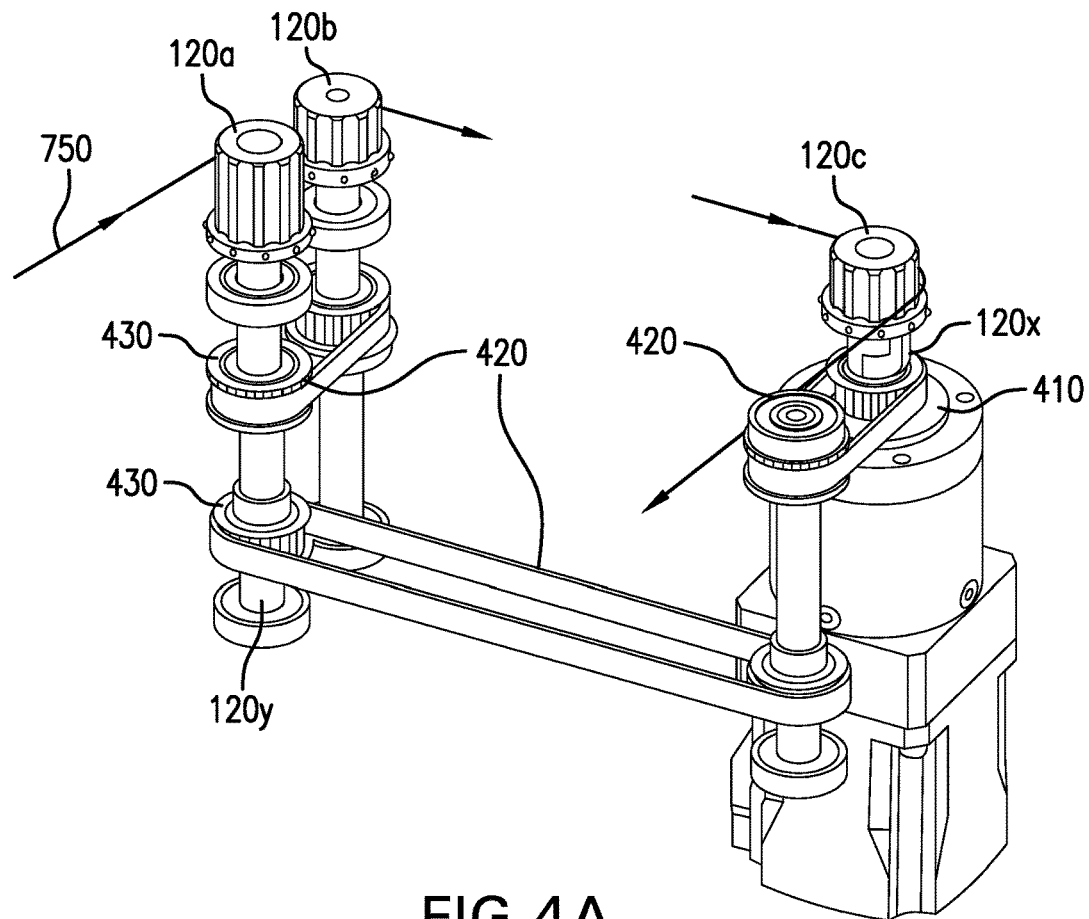
FIG. 4A is an illustration of aspects of a modular contact cutter.
Figure 4B:
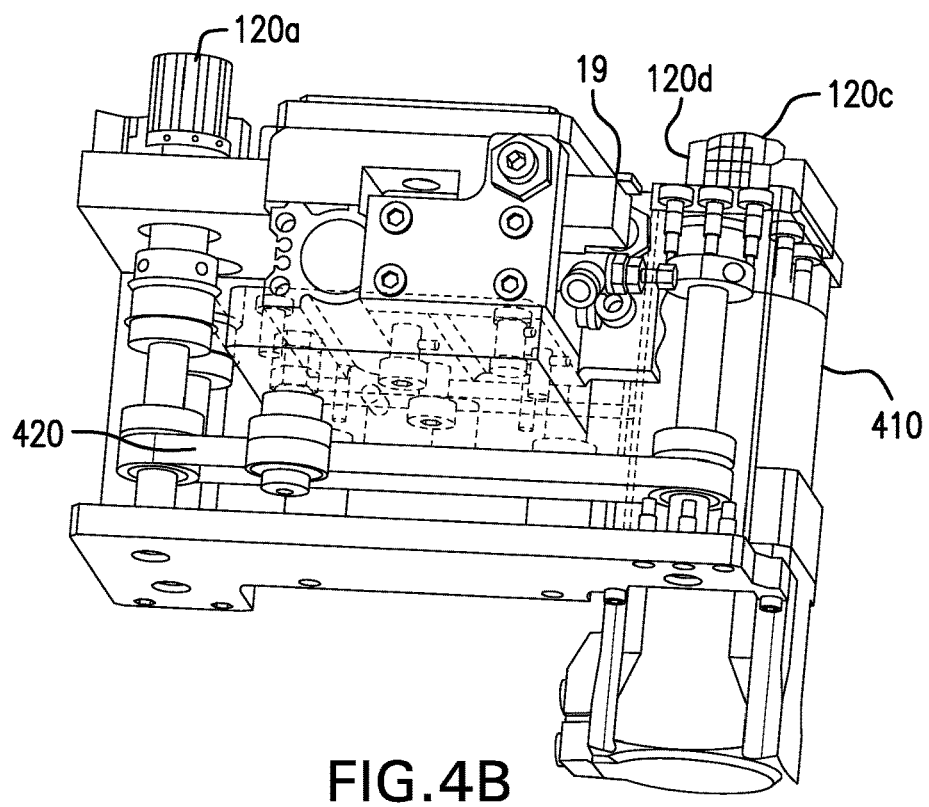
FIG. 4B is an illustration of aspects of a modular contact cutter.

FIGS. 4A and 4B illustrate the contact feeder drive path 750, comprising the drive flow path-dictating rollers 120. In FIGS. 4, all rollers are driven 120 by the main drive shaft 120*x* driven by motor 410. More specifically, drive belt(s) 420 and gearing 430 may distribute the drive from main shaft 120*x* across rollers 120.

More specifically, drive belt 420 may impart drive to inlet shaft 120*y*. Inlet drive shaft 120*y* may drive the inlet roller 120*a*, which allows for active loading of the bandoleer 206, as discussed further herein below.

The inlet roller 120*a* may feed the turn roller 120*b*, as discussed herein. The turn roller 120*b* feeds the bandoleer 206 across the cutter 19 to the receiving roller 120*c*. After cutting, receiving roller 120*c* may receive the bandoleer 206, and may feed it to the exit path (which may include an additional exit roller 120*d*).

Figure 5A:
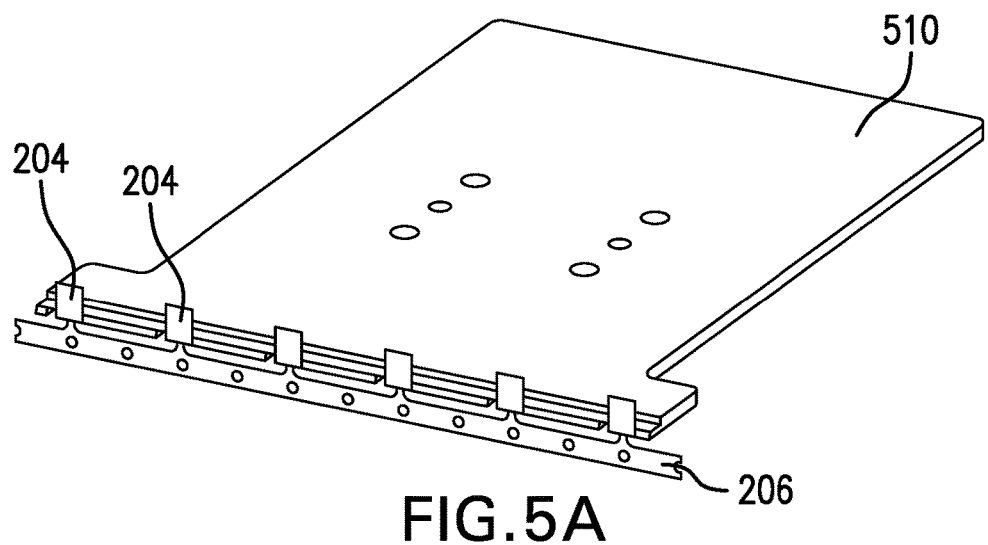
FIG. 5A is an illustration of aspects of a modular contact cutter.
Figure 5B:
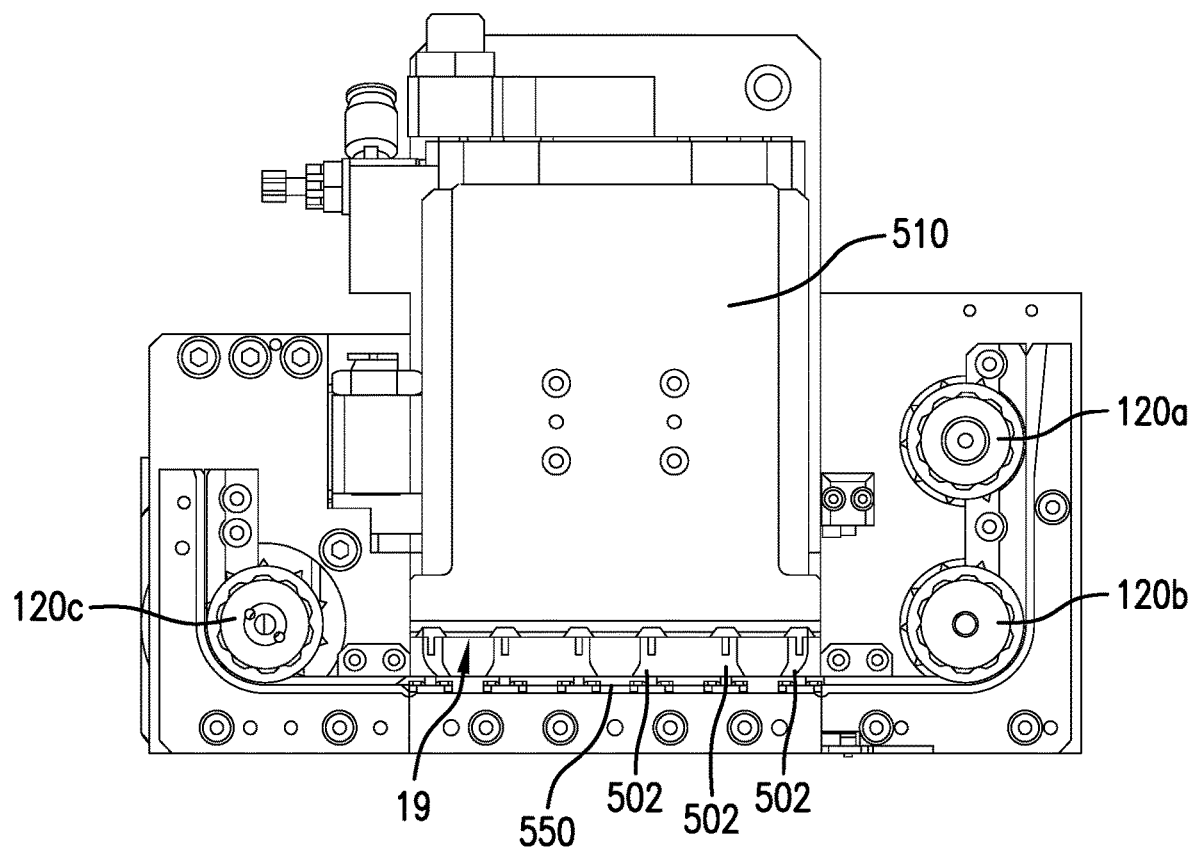
FIG. 5B is an illustration of aspects of a modular contact cutter.
Figure 5C:
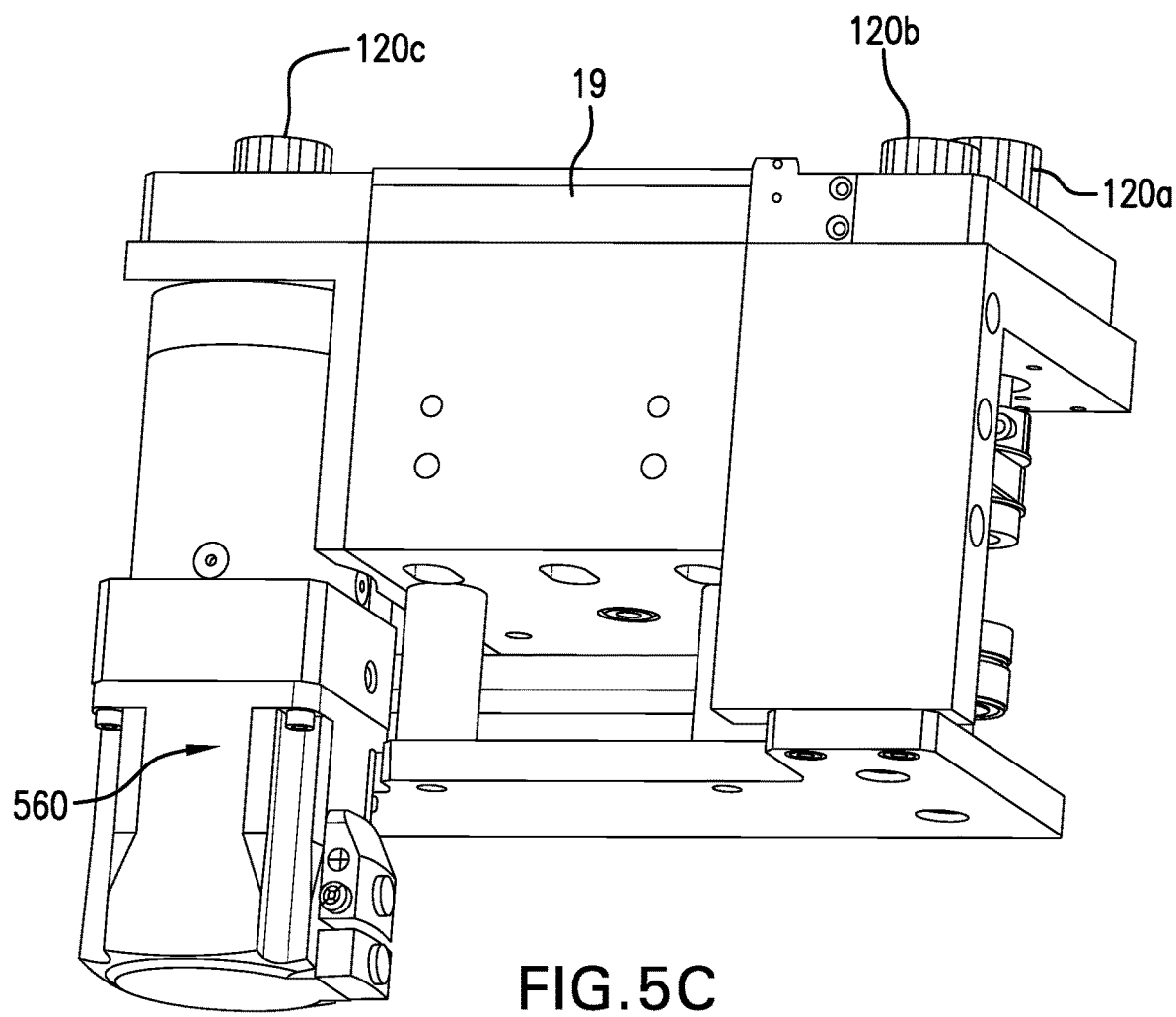
FIG. 5C is an illustration of aspects of a modular contact cutter.

FIGS. 5A, 5B and 5C illustrate comb 510 and cut features for the contact cutter 100. More specifically, FIG. 5A illustrates a comb 510. The comb 510 corrects positioning for the cut product, both before and after cutting. That is, in the exemplary embodiment using a bandoleer 206 and contacts 204, the comb 510 aligns the contacts 204 with the cutter 19, and more particularly with the individually tooled cut positions 502, for cutting. The comb 510 may contribute to the cut sequence, or aligning for a simultaneous cut.

More particularly and as additionally illustrated in FIGS. 5B and 5C, the comb 510 may align the bandoleer 206 for cutting, and may direct scrap, miscut contacts, and dropped/unpicked contacts 204 into scrap port 550. Scrap port 550 may be in communication with scrap container 560, by way of example.

Figure 6A:
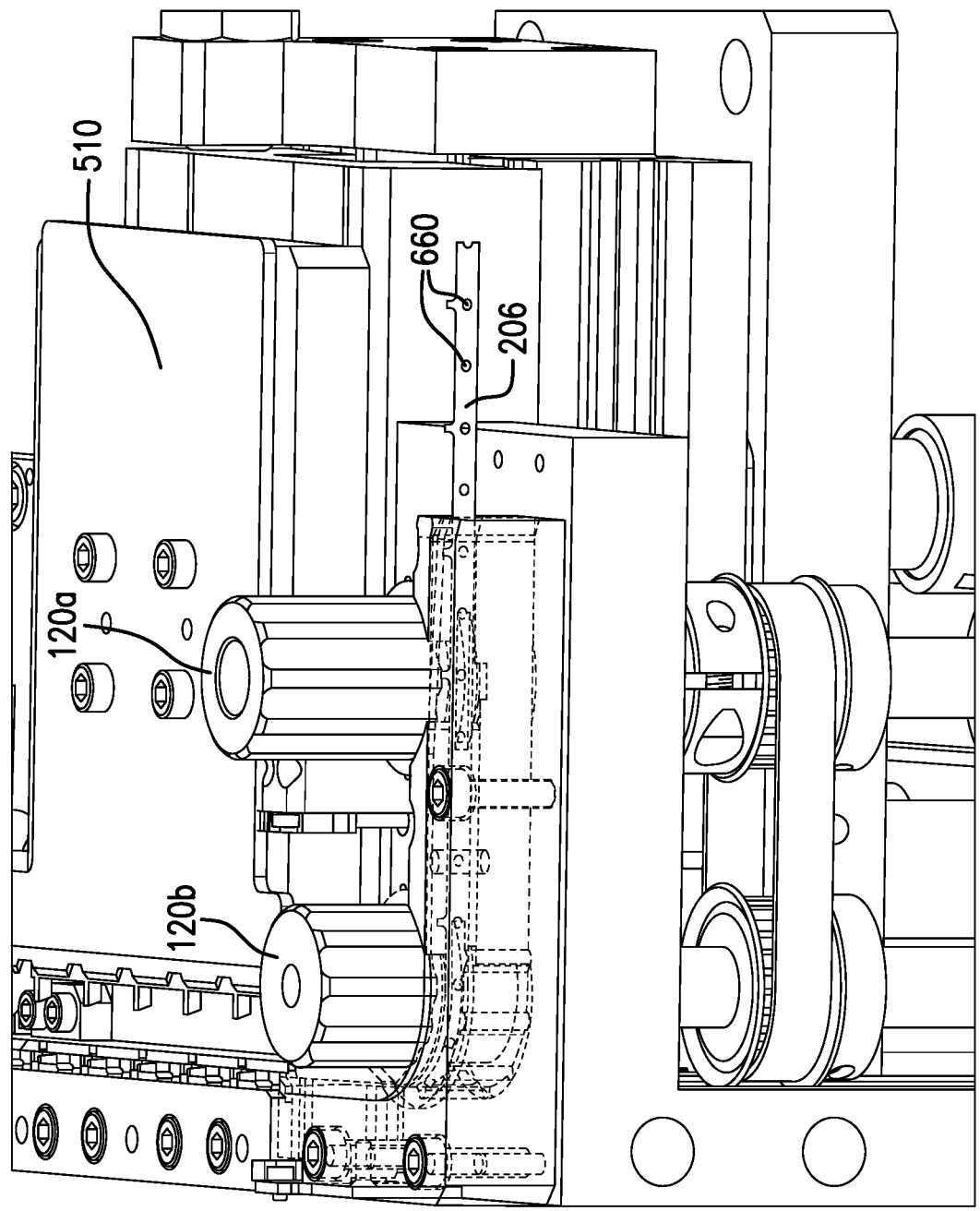
FIG. 6A is an illustration of aspects of a modular contact cutter.
Figure 6B:
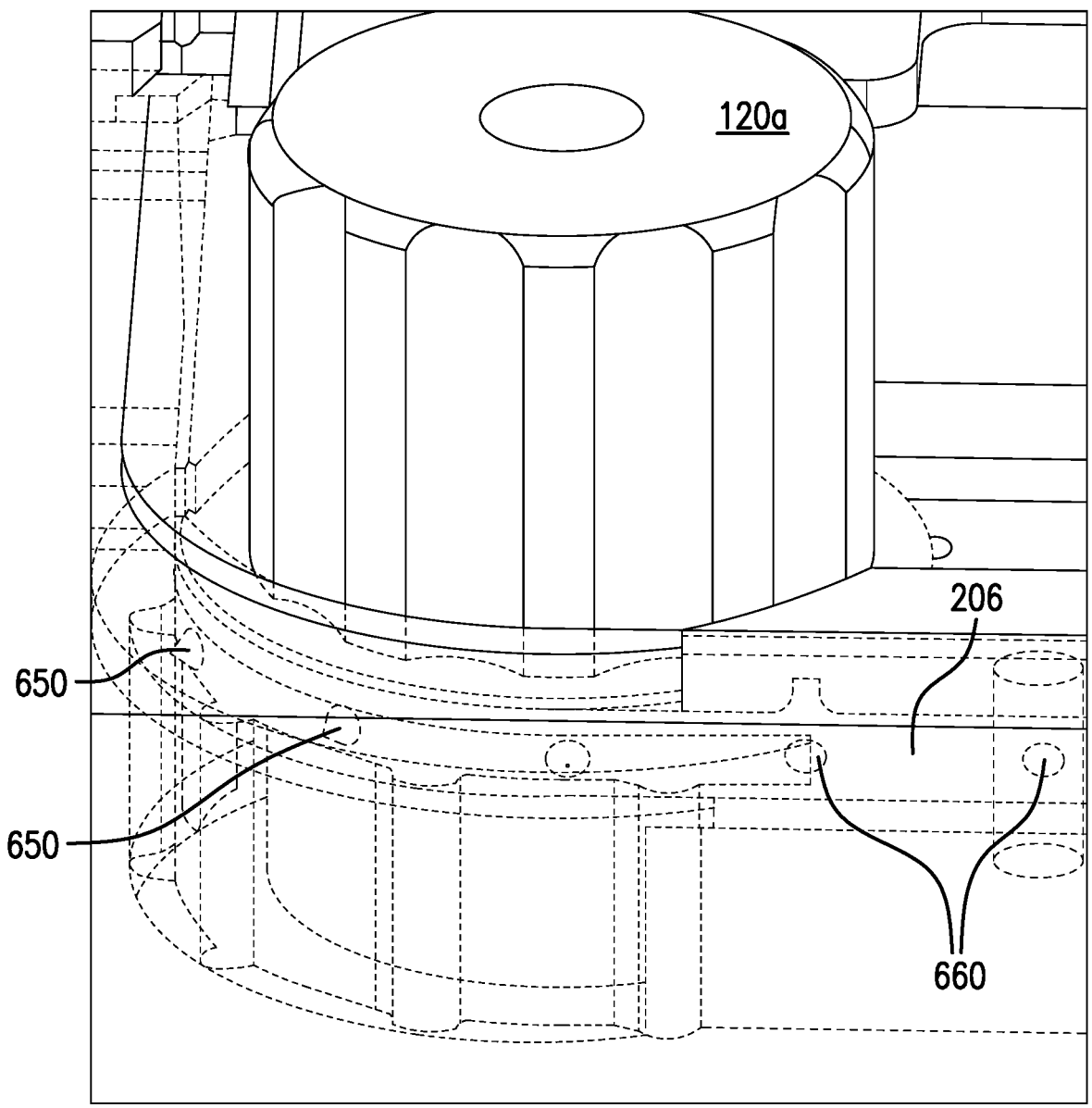
FIG. 6B is an illustration of aspects of a modular contact cutter.

FIGS. 6A and 6B illustrate an exemplary embodiment of bandoleer 206 loading. Initially, the rollers 120, and particularly the inlet roller 120*a*, may enter load mode. The bandoleer may be engaged, such as with a drive pin or pins on inlet roller 120*a*, and may follow the initial drive flow along the bandoleer guide to the turn roller 120*b*. This engagement pin(s) 650 are illustrated with particularity in FIG. 6B.

More specifically and as illustrated in FIG. 6B, the engagement pins 650 are integral to the turn roller 120*b*, and may engage the bandoleer 206, such as at drive impressions 660 along bandoleer. Engagement with the turn roller 120*b*, and the turn of the bandoleer 206 along the drive flow 750 to the cutter 19, may be aided by the bandoleer guide, which may extend from before the inlet roller 120*a* to around the turn to the cutter 19.

In load mode, the motor 410 (not shown in FIG. 6) may be clutched, may freewheel, may retract, or may run in any other suitable mode to provide the load operation, load alignment, and/or to provide retraction/de-jamming. For example, to thread the bandoleer an index hole may encounter a pin that grasps the hole and blocks the path of the bandoleer. The inlet roller 120*a* may have a one way clutch which free wheels forward, so as to continue to thread the bandoleer onto the inlet roller 120*a* (and additional pins, when present). Of course, the skilled artisan will appreciate that that bandoleer 206 may be slacked, such as 100 mm of slack, during loading (and during run time) to prevent overstretch of the bandoleer.

Once the bandoleer is wound at the turn roller 120*b* in load mode, run mode may begin. In embodiments, in run mode, the bandoleer is run across the turn pulley and across the cutting position, such that the contacts are placed substantially at each cutting tool position for cutting. This is then repeated for a series of cuts.

Across the cutter from the turn pulley is the receiving pulley. The receiving pulley receives the bandoleer stretched across the cutter, and then feeds the bandoleer to the exit pulley.

The foregoing apparatuses, systems and methods may also include the control of the various robotic and gripping functionality referenced throughout. Such control may include, by way of non-limiting example, manual control using one or more user interfaces, such as a controller, a keyboard, a mouse, a touch screen, or the like, to allow a user to input instructions for execution by software code associated with the robotics and with the systems discussed herein. Additionally, and as is well known to those skilled in the art, system control may also be fully automated, such as wherein manual user interaction only occurs to "set up" and program the referenced functionality, i.e., a user may only initially program or upload computing code to carry out the predetermined movements and operational sequences discussed throughout. In either a manual or automated embodiment, or in any combination thereof, the control may be programmed, for example, to relate the known positions of contacts, the robotics, and the relative positions there between, for example.

It will be appreciated that the herein described systems and methods may operate pursuant to and/or be controlled by any computing environment, and thus the computing environment employed not limit the implementation of the herein described systems and methods to computing environments having differing components and configurations. That is, the concepts described herein may be implemented in any of various computing environments using any of various components and configurations.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather is to be accorded the widest scope consistent with the principles and novel features disclosed herein.

What is claimed is:

1. An automated contact cutter, comprising:
    a contact reel holder for holding therein a bandoleer comprising a plurality of stamped contacts integrated thereon;
    at least an inlet roller comprising an inlet pin, a turn roller, and a receiving roller mechanically connected by at least one common motor drive belt to a drive motor, wherein the inlet roller is proximate to and uphill from the contact reel holder and is capable of receiving an end portion of the bandoleer onto the inlet pin for loading of the bandoleer;
    a cutter between the turn roller and the receiving roller that is capable of cutting ones of the stamped contacts from the bandoleer, as portions of the bandoleer are advanced between the turn roller and the receiving roller, for picking by a pick and place robot; and
    a comb capable of combing at least the bandoleer and cut and partially cut ones of the stamped contacts towards the cutter.

2. The automated contact cutter of claim 1, further comprising a deck mount.

3. The automated contact cutter of claim 1, further comprising reorientation rollers along the uphill, wherein the orientation rollers reorient the bandoleer from a horizontal orientation, to a 45 degree orientation, to a vertical orientation.

4. The automated contact cutter of claim 1, further comprising a paper separator along the uphill and before the inlet roller that is capable of separating backing paper from the bandoleer.

5. The automated contact cutter of claim 4, wherein the paper separator comprises a pinch roller and a dedicated stepper motor.

6. The automated contact cutter of claim 1, further comprising a post-processed bandoleer scrap exit tube after the exit roller.

7. The automated contact cutter of claim 6, further comprising a scrap port for receiving the post-processed bandoleer scrap.

8. The automated contact cutter of claim 1, wherein the cutter comprises 6 cutting positions.

9. The automated contact cutter of claim 1, further comprising a motor encoder to assess and maintain position of the motor.

10. The automated contact cutter of claim 9, further comprising a planetary gear reduction for the at least one common drive belt.

11. The automated contact cutter of claim 1, wherein the motor comprises a stepper motor.

12. The automated contact cutter of claim 1, further comprising a guide between at least the input roller, turn roller, the cutter, and the receiving roller, which is capable of maintaining the position and orientation of the bandoleer.

13. The automated contact cutter of claim 1, further comprising at least a missing part sensor proximate to the turn roller.

14. The automated contact cutter of claim 13, wherein the missing part sensor comprises an optical through-beam sensor.

15. The automated contact cutter of claim 1, wherein the cutter comprises an interchangeable module.

16. The automated contact cutter of claim 1, wherein the cutter operates sequentially to cut resident ones of the stamped contacts.

17. The automated contact cutter of claim 1, wherein the cutter operates simultaneously to cut resident ones of the stamped contacts.

18. The automated contact cutter of claim 1, wherein at least the inlet roller and the cutter are configurable as to pitch density, presentation orientation, and presentation length of the bandoleer.

19. The automated contact cutter of claim 1, wherein the bandoleer engages with the inlet pin via a plurality of impressions on the bandoleer.

20. The automated contact cutter of claim 1, wherein the motor is a freewheel clutched motor.

* * * * *